United States Patent [19]

Hayden et al.

[11] 4,400,761

[45] Aug. 23, 1983

[54] COMPACT RELAY SYSTEM

[75] Inventors: Rodney Hayden, Stoney Creek; Mario Guarasci, Niagara Falls, both of Canada

[73] Assignee: TRW Inc., Cleveland, Ohio

[21] Appl. No.: 346,456

[22] Filed: Feb. 8, 1982

[30] Foreign Application Priority Data

Jun. 12, 1981 [CA] Canada .................................. 379619

[51] Int. Cl.[3] ......................... H05K 7/02; H05K 7/06; H01H 47/04

[52] U.S. Cl. ..................................... 361/400; 335/199

[58] Field of Search ............... 361/400, 399, 395, 401, 361/405, 408, 206; 335/199

[56] References Cited

U.S. PATENT DOCUMENTS 3,878,489 4/1975 Rothweiler ......................... 335/199

FOREIGN PATENT DOCUMENTS 2109857 9/1971 Fed. Rep. of Germany ...... 335/199

2352381 12/1977 France ............................... 335/199

*Primary Examiner*—Harold Broome

*Attorney, Agent, or Firm*—James R. O'Connor

[57] ABSTRACT

An improved relay assembly comprising a relay, a circuit board and a base in which the relay is directly mounted to the circuit board terminals are mounted to the board and the assembly of relay board and terminals is then inserted and retained in the base. Interconnecting circuitry for connecting the terminals to the various elements of the relay and also for carrying out other chosen functions is provided by the circuit board and the connection of the relay and terminals to the board is carried out by one step soldering. The whole may be placed in the housing and be hermetically sealed. Variations of terminal structure arrangements for improved rigidity and reliability are described as well as details of relay structure and contact mounting.

16 Claims, 6 Drawing Figures

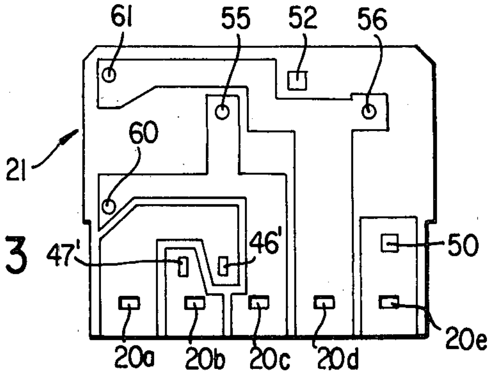
FIG. 3
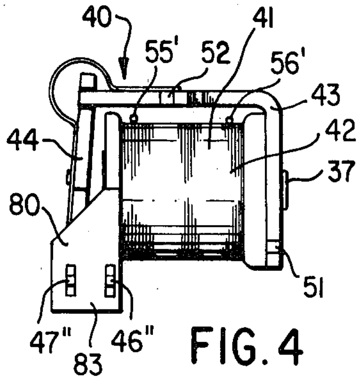
FIG. 4
FIG. 6
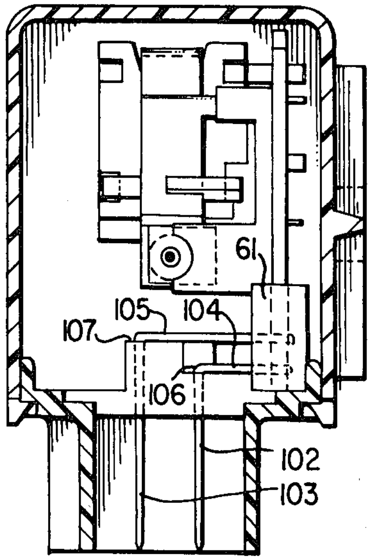
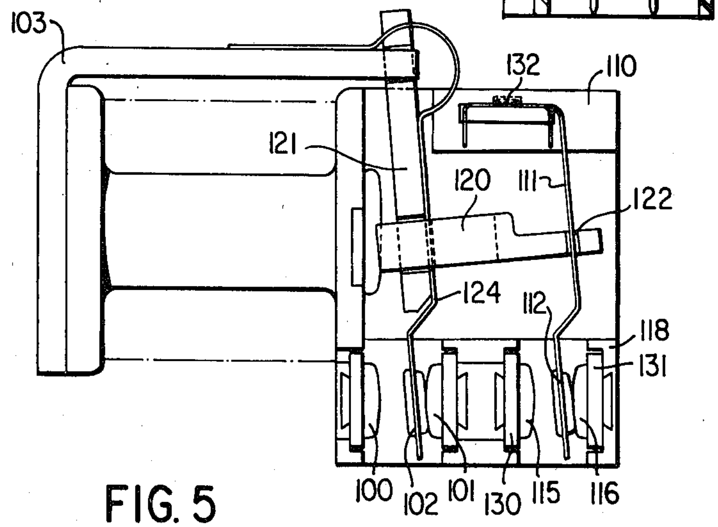
FIG. 5

COMPACT RELAY SYSTEM

This invention relates to an improved electro-magnetic relay system. It has particular reference to compact relay units which can provide additional functions beside that of merely switching load currents. Here described are improved relay assemblies which, for instance, can provide special time delays on make and/or break, variations of sensitivity, provision for multiple inputs and outputs, special transient or overvoltage protection, special interface or contact assemblies, in an article which is yet compact and rugged and can be fully protected from adverse environmental conditions.

This kind of relay unit can find application particularly in automotive, marine and aircraft environments, in a wide variety of machinery, and in domestic and commercial appliances.

With the growing presence of micro computer control in all types of machinery which is becoming more complex and capable of increasingly sophisticated performance, there is a need for low cost, and versatile relays for effecting instructions from and, in instances, feeding back information to the control. The effected instruction is usually in a current carrying circuit which may offer quite a heavy load and will normally also contain a very considerable amount of reactance. Heavy current carrying solid state devices are now available, however, they must be protected from transients and flashover and when in operation develop considerable quantities of heat which must be dissipated. This can be a real problem if space or if air circulation or other coolant facilities are limited, and in very many instances electro-magnetic relays prove to be much more suitable for handling the currents concerned, in providing the required isolation when in the open contact condition, in being far less susceptible to problems caused by reactive circuitry, and in reliable durability. However, the use of relays can be complicated since the circuits controlling such relays often have available only low currents and/or voltages for such control and may themselves provide special signals, or coded information, or the relay may be required to accept several possible inputs on which action should be taken only in certain combinations of such inputs. Such input signals themselves may be liable to transient interference. The result is that "smart" relays and systems are required which must be custom prescribed and designed for the particular function which they will be required to fulfill.

It is an object of the present disclosure to meet this problem and to provide a relay system which is compact, which allows great versatility in the switching function provided which is practically unlimited in the type of control which it can accept and which itself can carry out various logic, delay or other processing functions on its input or inputs before taking action. The disclosure also provides a relay and system which is rugged, compact and which may be partly or fully assembled on automatic machinery with consequent possibilities of unit cost reduction while at the same time allowing complete flexibility in design prescription for the type of function of the relay and its response to inputs provided.

More particularly in accordance with the invention there is provided an improved relay assembly which comprises a relay, a circuit board, and a base, said relay comprising, a magnetic yoke, a winding mounted on said yoke, armature means mounted to said yoke carrying first contact means, second contact means on said relay for engagement by said first contact means, said relay having connection means protruding to a chosen one side of said relay for insertion into one side of said circuit board, said circuit board comprising conductive cladding on the other side of said board, said connection means being connected to said cladding, said cladding providing chosen interconnecting circuitry for said relay, and a plurality of terminals arranged at one edge of said board each terminal having a part extending through a respective slot defined in said board and connected to said cladding for effecting individual circuit connections from each of said terminals to said interconnecting circuitry, each of said terminals also being received in a respective slot in the base and resiliently retained in said respective slot by engagement of said terminal with the material of said base, said terminals providing accessible connecting means at said base for electrical connection to said interconnecting circuitry for operation of said relay. A housing may enclose the relay and board assembly and be fastened to the base and may be hermetically sealed to it. Additional electronic means may be mounted on the circuit board forming part of the interconnecting circuitry. The base may have upstanding lugs integral with it with grooves for receiving and supporting the circuit board. The terminals may have outwardly formed lugs with an overhang in the base projecting into each of the slots, the lugs and overhang mutually locking to retain the terminals in the base. A resilient strip may be placed between the edge of the board and the base. An extension ear may be formed on a bobbin in the relay forming a housing for the second contact means with a connector from the second contact means to the cladding. The relay may have a second armature spaced from the first carrying third contact means for engagement with fourth contact means. There may be a second plurality of terminals spaced laterally of the base of the first set and also extending through the board. So the first contact means may be connected to the yoke with an integral section of the yoke projecting through the board for connection to the cladding and also acting as retaining means for the relay on the board.

Specific embodiments of the invention will now be described having reference to the accompanying drawings in which:

FIG. 3 is a plan view of a typical circuit board conductor layout;

FIG. 4 is a view of the relay of FIG. 1 from the circuit board side in the direction of arrow IV of FIG. 2;

FIG. 5 illustrates a modified relay contact arrangement for double pole throw switching, and FIG. 6 is an end view similar to FIG. 2 illustrating an embodiment comprising two sets of terminals.

Figure 1:
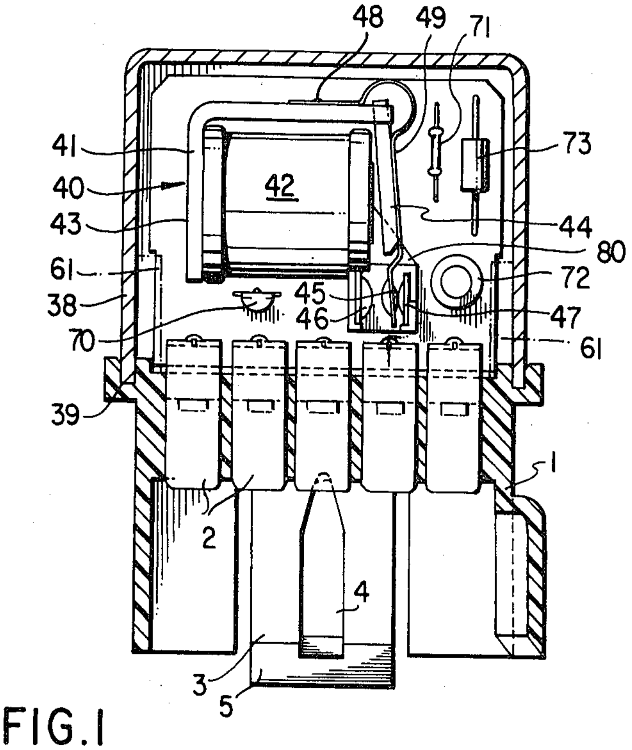
FIG. 1 is a side view partly in section illustrating a novel relay assembly and combined circuitry on a typical socket base as employed in automotive applications.
Figure 2:
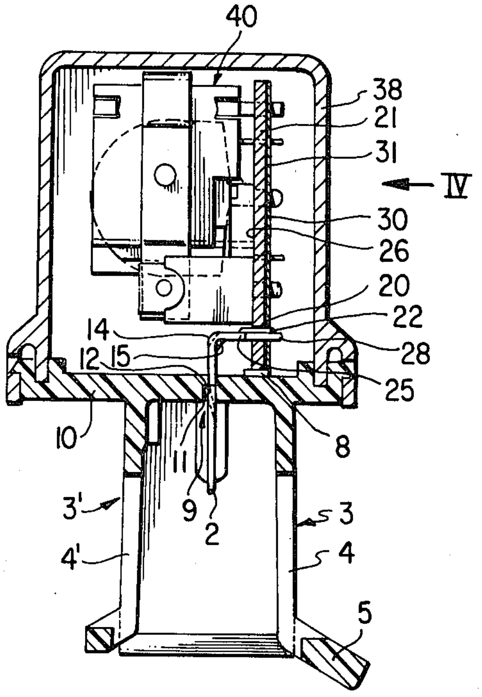
FIG. 2 is an end view also partly in section of the device of FIG. 1 in which certain components have been omitted for clarity, illustrating circuit board mounting on to terminals of the socket member.

As illustrated in FIGS. 1 and 2, an embodiment of the invention comprises a connector socket base 1 within which are located a plurality of terminals 2 for receiving a conventional automotive connector (not shown) which can be locked in position by plastic latching arms 3 and 3'. Projecting ears on the connector engage in the slots 4 and 4' of latches 3 and 3' when the connector is coupled, and the latch 3 can be unlocked from the connector such as by engagement of a screwdriver against tab 5, all in conventional manner. The terminals 2 have a detailed structure shown in FIG. 2, extending through slots 9 in the end 10 of base 1 and are themselves locked (as later described) in the base by outwardly formed deflected lugs 11 which engage under an overhang 12 in each slot 9. The terminals are reinforced at bend 14 by inwardly off-set pressed ribs 15 and are inserted to pass through slots 20 in a circuit board member 21. The board and terminals firmly engage one another in the slots 20 by virtue of upwardly expressed ridges 22. The inner ends of the terminals are relieved at 25 to engage the face 26 of the board 21 at the slots. Thus, the terminals and the board initially grip one another by virtue of the engagement of the ridges 22 and shoulders 25 with the inside of the slot 20 and the face 26 respectively. Each terminal projects through the circuit board at 28 and is subsequently soldered to the copper cladding 31 on face 30 as described later. The cladding forms the connecting circuitry for the board in conventional manner so that each terminal 2 connects to the appropriate part of the circuit board as can be seen in FIG. 3 representing a typical circuit lay-out.

The board 21 carries a square form relay 40, also illustrated in FIG. 4, with bobbin 41, winding 42, yoke 43 (which includes a core 37) and armature 44, with contacts 45 engageable alternatively with fixed contacts 46 and 47. The contacts 46 and 47 connect respectively to the circuit board cladding through slots 46' and 47' (illustrated for the circuit layout depicted in FIG. 3) and by short current paths in the cladding to their respective terminals 2 projecting through respective slots 20*a* and 20*b*. As can be seen in FIGS. 1 and 4, the yoke 41 by including an extension ear 80 allows the connections 46" and 47" to contacts 46 and 47 to be received through and mounted in a plastic support housing whose lower side at 83 (FIG. 4) bottoms against the face 26 of the circuit board. The relay yoke 43 connects to the board cladding at slot 50 by virtue of a projecting leg 51 on the yoke, thereby also providing a short current path to the terminal projecting through its respective slot 20. Contact 45 has a current path to the yoke through resilient bronze strip 49 spot welded to the yoke at 48. The strip also provides a resilient return spring for the armature 44. A second mounting lug 52 is also provided on the yoke and which projects through the board. It will be appreciated that if a shorter current path is needed for the contact 46, simple re-design of the circuit board layout allows a direct short connection, for instance, from slot 46' to the terminal slot 20*c*.

In the arrangement shown, the winding 42 carries two projecting leads 55' and 56' which pass through slots 55 and 56 for soldered contact with the board cladding and electrical connection through the cladding to terminal slots 20*c* and 20*d*. In this particular layout depicted in FIG. 3, additional slots 60 and 61 are provided in the board to allow the mounting of a diode 73 in parallel with the winding to conduct the voltage surge on deenergisation due to the inductance of the winding.

As will be appreciated by those skilled in the art, once all the components relay and terminals 2 have been inserted on the circuit board with their leads passing through to the clad side 31, they are soldered to the cladding most preferably by passing the clad side horizontally over a wave soldering bath. The terminals also thus become soldered to the cladding. Individual soldering can be used instead, but on a mass production basis would not be expected to be economical. If additional current carrying capacity from connections 46", 47" or 50 is required the entire surface of the cladding between these connections and their respective terminals 20 can be left bare (without the application of solder resist) so that in the soldering bath a complete layer is deposited over the cladding path to reduce the resistivity. Obviously, a thicker cladding, a double solder deposit or high conductivity metal such as silver may be used in other instances to reduce resistivity.

When the terminals and components have been soldered to the board the board is grasped and the lower ends 2' of the terminals 2 are inserted into the slots 9, and the assembly forced down so that lugs 11 engage behind overhangs 12, and the lower end of the board resiliently presses against plastic strip 8 between it and the base 10. The unit is completely hermetically sealed by appropriate use of a hood or housing 38 sealed at 39 where it is received in the connector base 1. Upstanding lugs 61 formed on the base as illustrated in FIG. 6 in broken lines in FIG. 1 may be included as alternative support for the board whose edges are received in grooves formed in the lugs.

FIG. 6 also illustrates an embodiment in which there are two parallel sets of terminals 102 and 103. By arranging to support these terminals in the base so that they emerge at different respective levels 106 and 107 their offset parts 104 and 105 passing into the board are spaced from and therefore are electrically isolated from one another. The offset support which the two sets give to the board also improves the rigidity.

The circuit board can be simply re-designed or rearranged so that, for instance, a driver transistor is mounted on the board in series with the relay winding 42, and instead of the relays being fed directly from the terminals at slots 20*c* and 20*d*, one of these terminals may provide an input at a low current or high impedance (or both) for switching the transistor to supply the energizing current for the winding. Power supply for the transistor operation can be taken from another of the terminals as appropriate, and other resistive and capacitive elements can be mounted on the circuit board as required for the circuitry. Typically (to illustrate this concept) shown in broken lines in FIG. 1 are a driver transistor 70, a feed resistor 71 and a reservoir capacitor 72. Other components can be mounted elsewhere on the board including the location beneath the structure of the relay which stands off from the board providing ample space for components. This flexibility of design allows for instance for a timer circuit to be included for delaying energisation or deenergisation or both of the relay, or allows the inclusion of logic or gate circuitry for response to multiple inputs to the device. Other instances contemplate the inclusion of a decoder chip for response to a coded input etc. Signals can be returned to the control as appropriate from the terminal or terminals concerned. The number of terminals can be increased and their size varied to provide as many as may be required in any particular instance.

Typically the maximum dimension of the relay 40 illustrated is approximately 0.8" and the greatest dimension of the base 1 in FIG. 1 being no more than 1.75".

FIG. 5 by way of example, shows a modified form of relay, giving double pole double throw switching. In this arrangement the contacts 100 and 101 correspond to contacts 46 and 47 of the embodiments of FIGS. 1, 2 and 4 with the moving contact 102 electrically connected to yoke 103 similarly to contact 45 and yoke 43.

As illustrated in FIG. 5, the contact support ear 80 (previously described) is extended at 110 to mount a second flexible contact armature 111, carrying contacts 112 which can engage alternately against contacts 115 and 116 mounted in the forward extension 118 of the ear 110. An insulated connecting stem 120 straddles the armature 121, receiving the spring armature 111 through slot 122 for driving the armature 111 in unison with the contact 124 attached to armature 121. The rigid leads to the webs 130 and 131 to which the contacts 115 and 116 are mounted are arranged so that their lower ends pass through the circuit board through suitably positioned slots to contact the circuit board cladding for routing to appropriate terminals. The armature 111 carries a rigid strip lead 132 received in the ear extension 110 and which also passes through the circuit board for soldering in its turn to the appropriately located cladding circuitry.

It will therefore be clear to those skilled in the art that here disclosed is an arrangement of relay board circuitry and terminal mounting which allows the production of a wide variety of circuit arrangements both for relay driving and for switching to be picked up from the relay. Integral protection from transients and flashover can be incorporated and complete control over the impedance presented by the relay winding is possible. Because the unit is small it can be mounted where space is limited.

The embodiments of the invention in which an exclusive property or privilege is claimed are defined as follows:

1. An improved relay assembly which comprises, a relay, a circuit board, and a base, said relay comprising a magnetic yoke, a bobbin mounted on said yoke, an ear extending from said bobbin, a winding wound on said bobbin, armature means mounted to said yoke carrying first contact means, second contact means housed within said ear for engagement by said first contact means, said relay having connector means extending from said contact means and protruding to a chosen one side of said relay for insertion into one side of said circuit board, said circuit board comprising conductive cladding on the other side of said board, said connector means extending through said circuit board and being connected to said cladding, said cladding providing chosen interconnecting circuitry for said relay, and a plurality of terminals arranged at one edge of said board each terminal having a part extending through a respective slot defined in said board and connected to said cladding for effecting individual circuit connections from each of said terminals to said interconnecting circuitry, each of said terminals also being received in a respective slot in the base and resiliently retained in said respective slot by engagement of said terminal with the material of said base, said terminals providing accessible connecting means at said base for electrical connection to said interconnecting circuitry for operation of said relay.

2. An improved relay assembly as defined in claim 1, including housing means enclosing said relay and board assembly and fastened to said base.

3. An improved relay assembly as defined in claim 2, said housing being hermetically sealed to said base.

4. An improved relay assembly as defined in claim 1, said base having upstanding lugs integral with the base, grooves defined in the lugs for slidingly receiving sides of said circuit board and supporting said circuit board when the terminals are received in the base.

5. An improved relay assembly as defined in claim 1, comprising additional electronic circuit means mounted to said circuit board adjacent said relay and forming part of said interconnecting circuitry.

6. An improved relay assembly as defined in claim 1, said interconnecting circuitry comprising electronic impedance transfer means for actuating said relay.

7. An improved relay assembly as defined in claim 6, said transfer means having an input connected to a chosen one of said terminals.

8. An improved relay assembly as defined in claim 5, said interconnecting board circuitry comprising a diode electrically connected across said winding.

9. An improved relay assembly which comprises a relay, a circuit board, a base having a plurality of slots and overhangs projecting into said slots, and a resilient strip disposed on said base proximate said slots, said relay comprising a magnetic yoke, a winding mounted on said yoke, armature means mounted to said yoke carrying first contact means, second contact means on said relay for engagement by said first contact means, said relay having connection means protruding to a chosen one side of said relay for insertion into one side of said circuit board, said circuit board comprising conductive cladding on the other side of said board, said connection means being connected to said cladding, said cladding providing chosen interconnecting circuitry for said relay, and a plurality of terminals arranged at one edge of said board each terminal having a part extending through a respective slot defined in said board and connected to said cladding for effecting individual circuit connections from each of said terminals to said interconnecting circuitry, each of said terminals also having an outwardly deflected lug, each of said terminals being seated in a slot in the base, each of said lugs resiliently engaging an overhang to lock said terminals in said base and bias the edge of said board proximate said terminals against said resilient strip on said base, said terminals providing accessible connecting means at said base for electrical connection to said interconnecting circuitry for operation of said relay.

10. An improved relay assembly as defined in claim 9, said terminals having said parts extending perpendicularly from said circuit board and then being deflected at right angles parallel to and away from said board, and a raised rib formed in said part of each terminal for tight fitting engagement of said terminal in the respective slot in said board by engagement of said rib against the edge of said respective slot in said board.

11. An improved relay assembly as defined in claim 10, including an offset shoulder adjacent said rib engaging the one side of said board for limiting penetration of that respective terminal into said board.

12. An improved relay assembly as defined in claim 1, comprising a second plurality of said terminals based laterally of said base and having parts extending through said board spaced inwardly of said board edge with respect to said first plurality of terminals.

13. An improved relay assembly as defined in claim 12, the terminals in each set being parallell.

14. An improved relay assembly as defined in claim 1, said relay comprising a second armature spaced from said first mentioned armature and carrying third contact means for engagement with fourth contact means, said fourth contact means being housed in a second ear formed on said bobbin and including respective connector means extending through said board and connected to said cladding.

15. An improved relay assembly as defined in claim 14, comprising an insulated operating stem between said first and second armatures.

16. An improved relay assembly which comprises a relay, a circuit board, and a base, said relay comprising a magnetic yoke, a winding mounted on said yoke, armature means mounted to said yoke carrying first contact means which are connected to said yoke, second contact means on said relay for engagement by said first contact means, said relay having connection means protruding to a chosen one side of said relay for insertion into one side of said circuit board, said circuit board comprising conductive cladding on the other side of said board, said connection means being connected to said cladding and including an integral section of said yoke projecting through said board, which yoke section also provides retaining means for fixing said relay to said board, said cladding providing chosen interconnecting circuitry for said relay and a plurality of terminals arranged at one edge of said board, each terminal having a part extending through a respective slot defined in said board and connected to said cladding for effecting individual circuit connections from each of said terminals to said interconnecting circuitry, each of said terminals also being received in a respective slot in the base and resiliently retained in said respective slot by engagement of said terminal with the material of said base, said terminals providing accessible connecting means at said base for electrical connection to said interconnecting circuitry for operation of said relay.

* * * * *